(12) United States Patent
Takahashi

(10) Patent No.: US 7,770,275 B2
(45) Date of Patent: Aug. 10, 2010

(54) METHODS FOR MANUFACTURING TUNING-FORK TYPE PIEZOELECTRIC VIBRATING DEVICES

(75) Inventor: Takehiro Takahashi, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 12/199,719

(22) Filed: Aug. 27, 2008

(65) Prior Publication Data

US 2009/0058232 A1    Mar. 5, 2009

(30) Foreign Application Priority Data

Sep. 3, 2007    (JP)    ............................. 2007-227340

(51) Int. Cl.
*H04R 17/00*    (2006.01)
*H01L 41/047*    (2006.01)

(52) U.S. Cl. ..................... 29/25.35; 29/896.22; 29/846; 310/363; 310/365; 310/370

(58) Field of Classification Search ............... 29/23.35, 29/896.22, 831, 842, 846, 847; 310/324, 310/328, 363, 365, 370
See application file for complete search history.

(56) References Cited

U.S. PATENT DOCUMENTS 6,448,691 B1 *    9/2002    Takeuchi et al. ............ 310/324

FOREIGN PATENT DOCUMENTS

| JP | 59005725 A | * 1/1984 |
| JP | 2003-258331 | 9/2003 |
| JP | 2004-120802 | 4/2004 |

* cited by examiner

*Primary Examiner*—A. Dexter Tugbang
(74) *Attorney, Agent, or Firm*—Klarquist Sparkman, LLP

(57) ABSTRACT

In an exemplary method a profile outline of a desired piezoelectric vibrating piece is formed on a surface of a piezoelectric wafer. The piece includes a base and at least two arms extending from the base. On a surface of the wafer within the profile outline, a first metal layer is formed comprising at least one of Cr, Ni, and Ti. A second metal layer, of Au and/or Ag, is formed on at least one selected region of the first metal layer. An electrode pattern is formed on at least one selected region of the second metal layer. From at least one selected location within the electrode pattern, the second metal layer is peeled away to form an electrode on the piezoelectric vibrating device comprising the first metal layer but not the second metal layer.

8 Claims, 8 Drawing Sheets

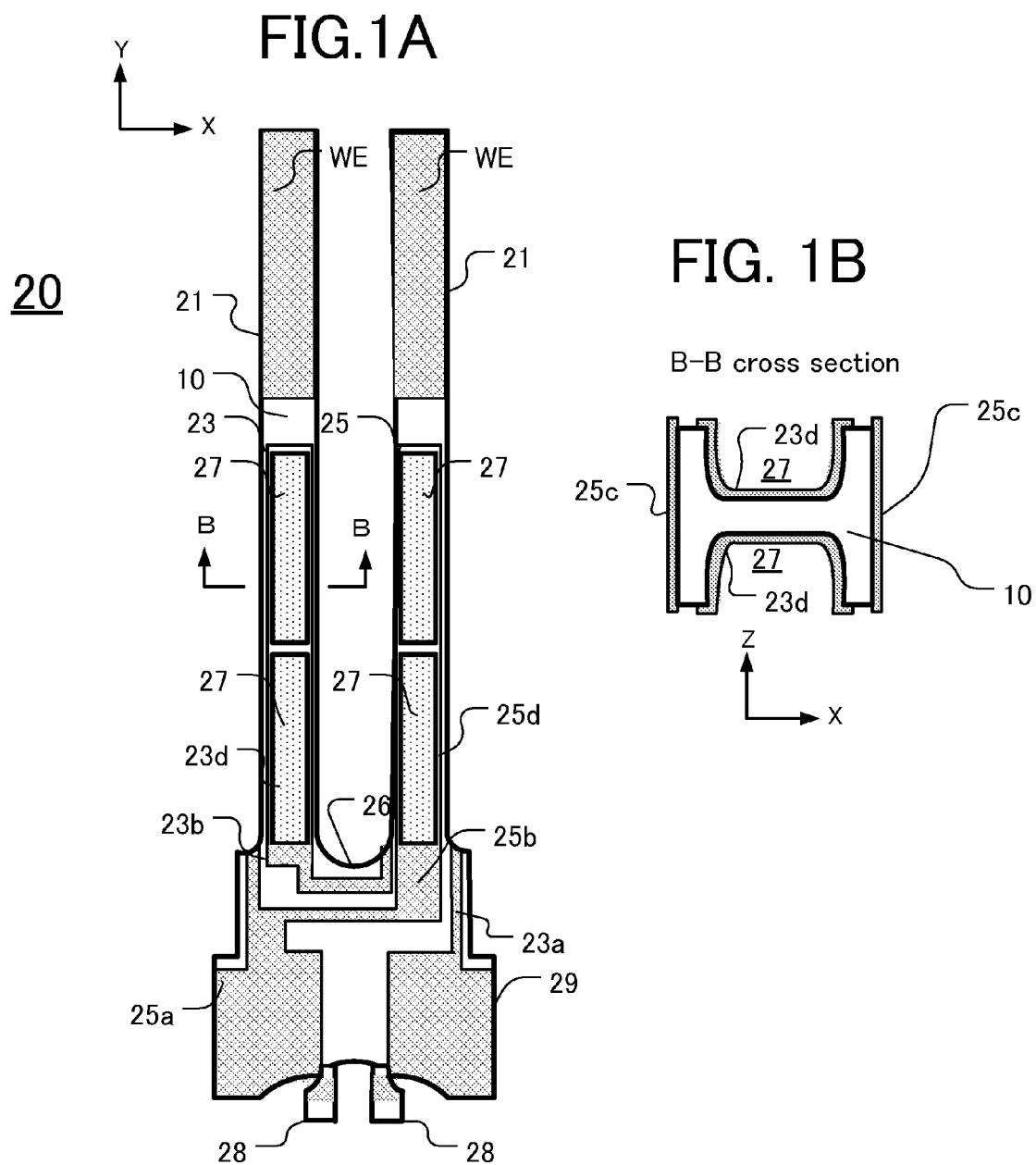

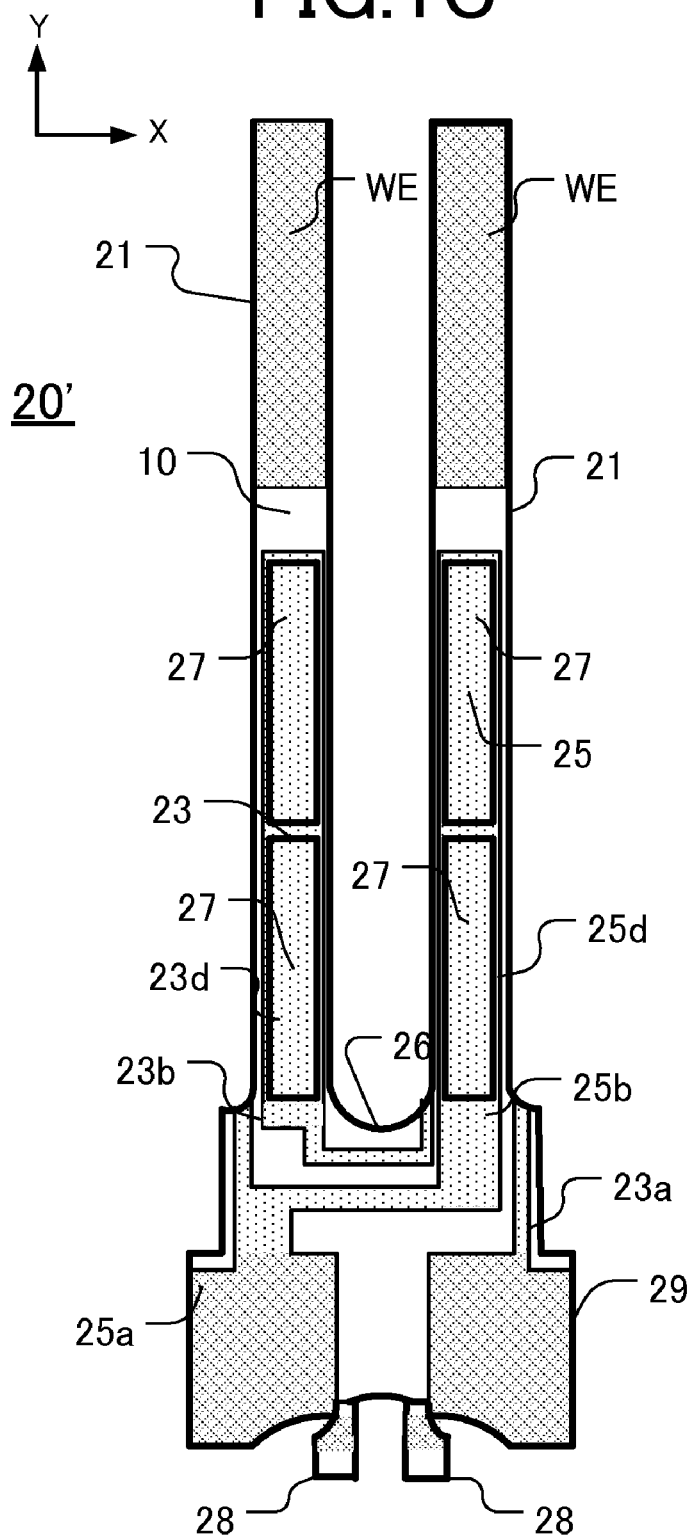

FIG.5
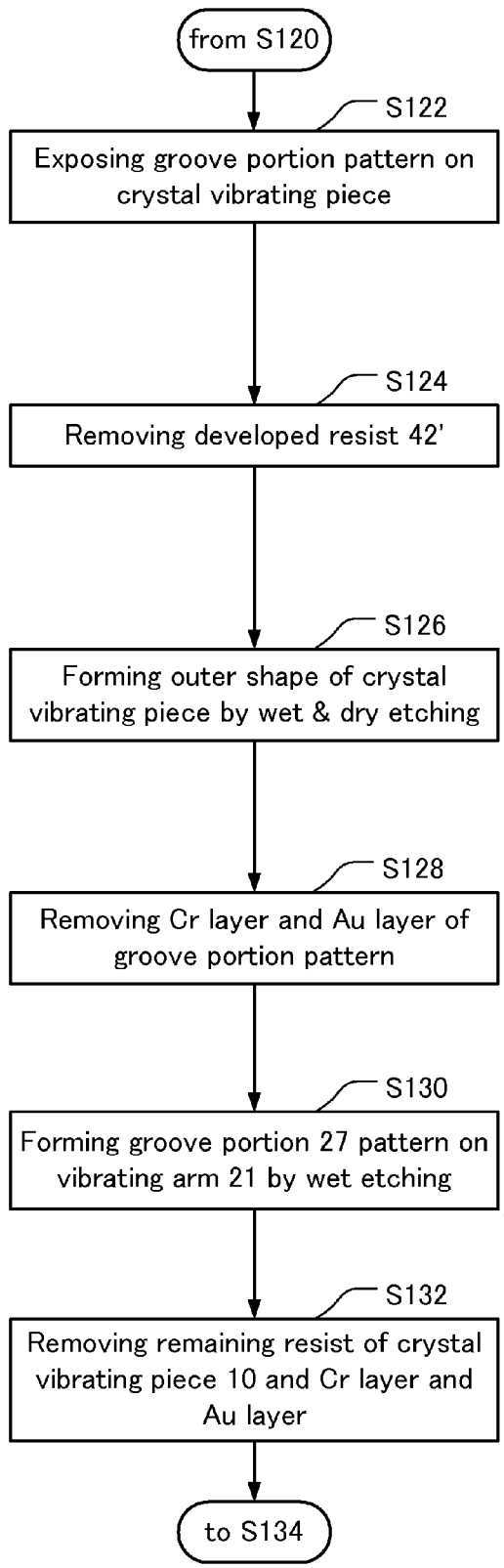
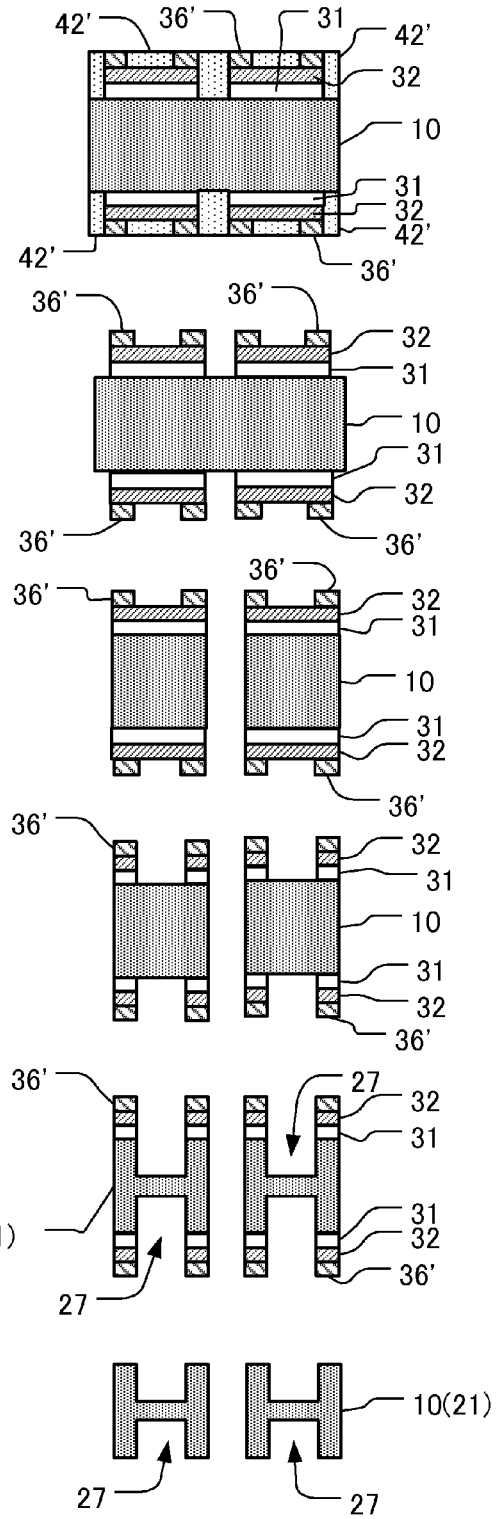

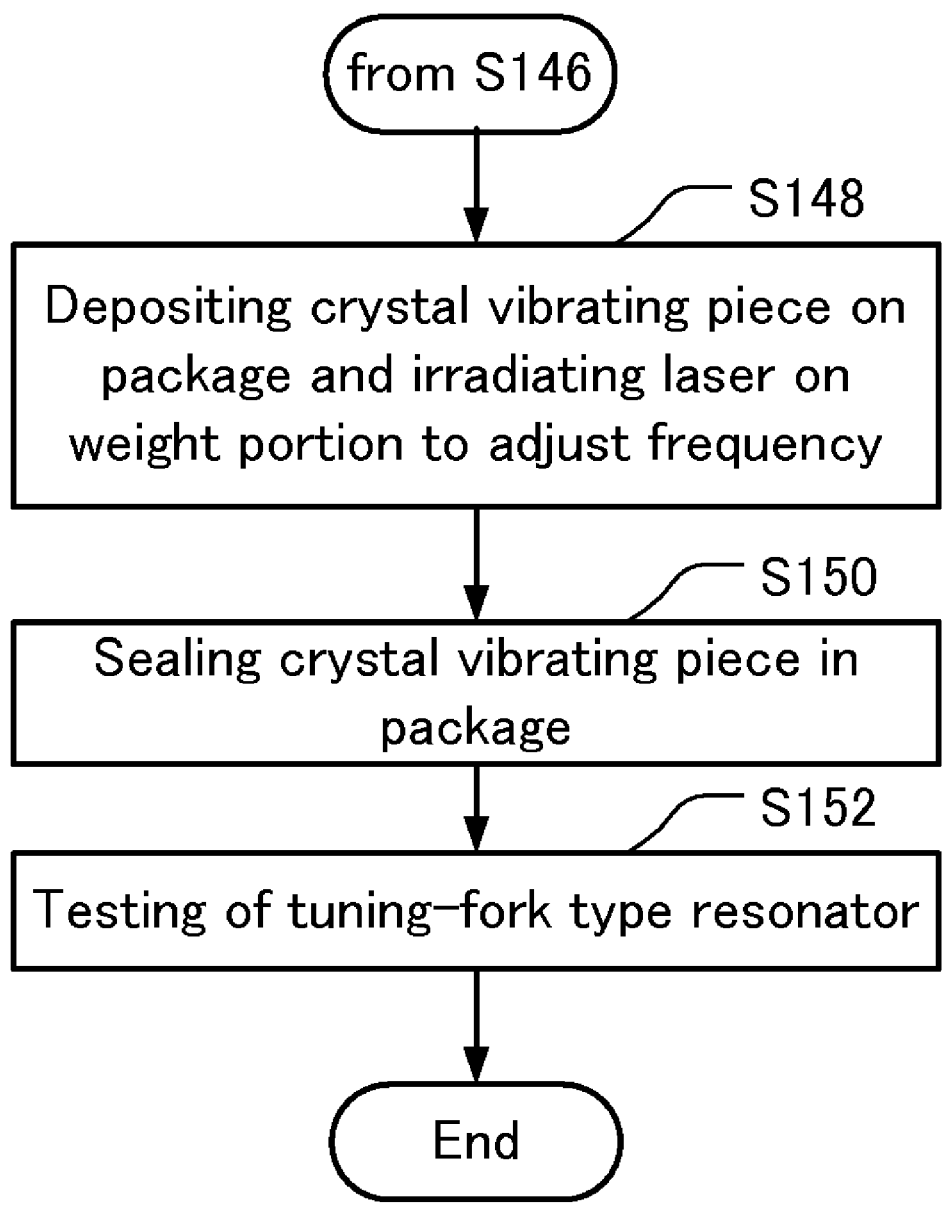

METHODS FOR MANUFACTURING TUNING-FORK TYPE PIEZOELECTRIC VIBRATING DEVICES

CROSS-REFERENCE TO RELATED APPLICATIONS

This application claims priority to, and the benefit of, Japan Patent Application No. 2007-227340, filed on Sep. 3, 2007, in the Japan Patent Office, the disclosure of which is incorporated herein by reference in its entirety.

FIELD

This disclosure relates to, inter alia, piezoelectric vibrating devices, particularly devices having a "tuning-fork" configuration, and to methods for manufacturing such devices. The subject methods produce piezoelectric vibrating devices having particular electrode patterns and other features.

DESCRIPTION OF RELATED ART

Various types of clocks, home electric appliances, and consumer electronics, and various types of commercial/industrial electrical apparatus such as information/communication devices and Office-Automation devices utilize at least one oscillator. These oscillators typically are manufactured by packaging a piezoelectric resonator, a piezoelectric vibrating device, or an IC tip as a clock source for addition to and use by an electronic circuit of the apparatus. In other apparatus, piezoelectric timing devices such as real-time clock modules are widely used. Other uses for piezoelectric vibrating devices include in apparatus for navigation-control or attitude-control of ships, aircraft, and automobiles; angular-velocity sensors in image-stabilizers and other detectors used in video cameras and the like. Also, piezoelectric vibrating gyros are widely used in various devices including rotation-direction sensors used in, e.g., three-dimensional mouse devices.

Especially nowadays, such piezoelectric vibrating devices must be increasingly miniaturized and/or provided with a thinner or lower profile to be accommodated in electronic devices and packaging schemes that are correspondingly miniaturized and/or provided with a lower profile. Also, modern piezoelectric devices must be able to provide a low CI (crystal impedance) value, high quality, and stability. One type of tuning-fork type piezoelectric vibrating device having vibrating arms has been developed for minimizing CI, discussed in Japan Unexamined Patent Application No. 2003-258331. In the manufacture of this device, a wafer comprising a piezoelectric single-crystal material is exposed in a photolithographic manner, and then placed in an etching solution that dissolves the crystal material. By performing this so-called "wet-etching," certain material is dissolved away in a controlled manner to form the desired profile of the tuning-fork type piezoelectric vibrating device. In particular, a corrosion-resistant film is formed on both sides of the crystal wafer. Then, a layer of photoresist is applied to both sides of the crystal wafer and dried to form resist films. A photo-mask defining the desired shape pattern corresponding to the profile of the tuning-fork type piezoelectric vibrating device is applied to the resist films on both sides of crystal wafer and exposed and developed.

A tuning-fork type piezoelectric vibrating device of which the vibrating-arm portions include grooved regions is discussed in Japan Unexamined Patent Application No. 2004-120802. Associated with the grooved regions are respective groove electrodes; other electrodes such as side electrodes may also be present. The groove electrodes and side electrodes on these devices comprise two layers in which, for example, chrome (Cr) is a lower layer and gold (Au) is an upper layer. These double-layer structures cause the tuning-fork type piezoelectric vibrating devices generally to exhibit undesirable stress on their vibrating-arm portions due to the different respective coefficients of thermal expansion of the crystal material and of gold (Au). This stress becomes apparent especially during thermal processes such as annealing and reflow being performed on the vibrating devices. The stress imparts undesired change to the vibrational frequency produced by the vibrating device (as defined by its shape), and the change in frequency causes undesired fluctuation of the CI value of the vibrating device. CI fluctuation undermines the vibration stability of vibrating device and produces excessive energy loss. Another driving force in the innovation of tuning-fork type piezoelectric vibrating devices is progressively lower cost.

Devices and methods disclosed herein reduce frequency fluctuations and CI fluctuations exhibited by piezoelectric vibrating devices that otherwise would be caused by these differences in the coefficients of thermal expansion during execution of thermal processes. Also disclosed are manufacturing processes, for making piezoelectric vibrating devices, that can be performed at reduced cost and that yield lower-cost product.

SUMMARY

One embodiment of a method for manufacturing piezoelectric vibrating devices comprises the step of forming, on a piezoelectric-crystal substrate, a profile outline of the piezoelectric vibrating device. A first metal film is formed, of at least one of chrome (Cr), nickel (Ni), and titanium (Ti), on the surface of the piezoelectric vibrating device of which the profile outline has been formed. Then, a second metal film is formed, of at least one of gold (Au) and silver (Ag), on the first metal film, thereby forming an electrode pattern on the first and second metal films. The second metal film is selectively removed ("peeled") from predetermined locations on the piezoelectric vibrating device. Selective peeling of the second metal layer can be performed after the electrodes have been formed in their desired electrode patterns on the first and second metal films. Thus, electrodes are formed that comprise, at least in selected regions thereof, only a single metal layer.

In another embodiment of the method for manufacturing a piezoelectric vibrating device, forming the electrode pattern includes the steps of applying a photoresist to the second metal film, performing a first exposure step to pattern the resist with the outline of the desired electrode pattern, and performing a first removal step in which exposed resist is removed, followed by etching or the like to remove the first and second metal films from regions revealed when the exposed resist was removed. Thus, the electrode pattern is formed by selectively removing portions of the first and second metal films by etching.

The peeling step can include a second exposing step performed after the first removal step. In the second exposure step, a photoresist is applied and exposed to pattern the photoresist in predetermined locations. Pattern shapes are defined by unexposed resist in the predetermined locations in the electrode pattern. In a second removal step, exposed resist is removed and revealed portions of the second metal film are removed by etching. Selected portions of the second metal film can also be removed by etching using the resist that remains after forming the electrode pattern.

The various manufacturing methods disclosed herein provide piezoelectric vibrating devices having a base and vibrating arms. At least a pair of arms extends from the base, and each arm includes grooves in predetermined positions. These and other predetermined positions are readily achieved by the subject methods. More specifically, the grooves are thinner regions of the arms. In these grooves, one or more regions can be located that comprise only the first metal film. Thinner portions of the arms are influenced more by thermal expansions of the second metal film relative to thermal expansions of the first metal film. By having selected regions of the groove include only the first metal film, fluctuations of the vibration frequency and/or of the CI value caused by differences in the coefficients of thermal expansion of the first and second metal films are reduced.

According to another aspect, tuning-fork type piezoelectric vibrating devices are provided. An embodiment of such a device comprises a base made of a piezoelectric material and at least a pair of vibrating arms extending from an edge of the base in a predetermined direction. The vibrating arms have grooves on which a first single metal film is formed of one or more of chrome (Cr), nickel (Ni), and titanium (Ti). A second metal film, having a higher coefficient of thermal expansion than the first metal film, is not formed on these surfaces in the grooves. As a result, fluctuations of vibration frequency and/or of CI value otherwise caused by the different coefficients of thermal expansion are reduced.

Another embodiment of a tuning-fork type piezoelectric vibrating device includes "weights" formed on distal surfaces of the vibrating arms. To form the weights, a second metal film can be formed on the first metal film over selected regions of the arms including intended weighted regions. Each weight is an area of the first and second metal films formed at a respective distal region of a vibrating arm. Adjustment of the vibration frequency of the arm is performed simply by selective removal of the first and second metal films from the weight region. By forming predetermined portions of the electrodes on the piezoelectric vibrating device as single metal layers rather than multiple layers of metal, frequency fluctuations that otherwise would be exhibited during thermal processes are reduced. In addition, since the second metal layer is substantially more limited in scope than the first metal layer, the amount of metal used for forming the second layer is less, which reduces cost.

Various embodiments are described with reference to the accompanying drawings.

BRIEF DESCRIPTION OF THE DRAWINGS

FIG. 1A is an enlarged schematic view of an embodiment of the tuning-fork type crystal vibrating device 20.

FIG. 1B is a cross-sectional view of the FIG. 1A embodiment, along the B-B line.

FIG. 1C is an enlarged schematic view of an alternative configuration 20' of the tuning-fork type crystal vibrating device.

FIG. 5 is a flow-chart of subsequent steps in the method begun in FIG. 4.

FIG. 7 is a flow-chart of steps for packaging and adjusting the tuning-fork type crystal vibrating devices.

DETAILED DESCRIPTION OF THE PREFERRED EMBODIMENTS

Tuning-Fork Type Crystal Vibrating Device 20

Figure 2A:
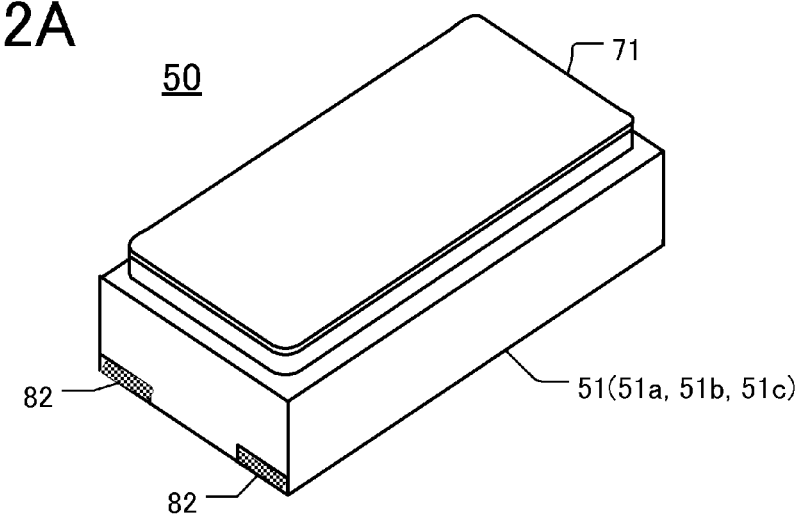
FIG. 2A is a perspective view of an embodiment of a crystal resonator 50.

FIG. 1A is a schematic depiction of the configuration of an embodiment of a tuning-fork type crystal vibrating device 20, and FIG. 1B is a cross-sectional view along the line B-B of FIG. 1A. The line B-B extends across one of the vibrating arms 21 of the device 20. To achieve the required degree of miniaturization and high quality, as shown in FIG. 1A, the device 20 comprises a base 29 and a pair of vibrating arms 21 extending from the base 29. The arms extend parallel to each other, in a tuning-fork configuration, from a top edge of the base 29. A crotch portion 26 of the pair of arms 21 includes a tapered or rounded region that reduces changes in or fluctuation of the resonance frequency of the arms that otherwise would be caused by ambient temperature changes. A V-shaped crotch portion 26 provides the tapered region, and a U-shaped crotch portion 26 (shown) provides the rounded region. This embodiment is described below with reference to the tuning-fork type crystal vibration device 20 having a pair of vibrating arms 21. But, in alternative embodiments, the device can comprise three or four vibrating arms 21, for example.

The tuning-fork type crystal vibrating device 20 of this embodiment produces a vibration frequency of, for example, 32.678 kHz. The device 20 is very small, approximately 1.7 mm long and 0.5 mm wide. On both the upper and lower surfaces of each arm 21, grooves 27 are defined. Two respective grooves 27 are situated on the upper (front) surface of one vibrating arm 21, and two respective grooves 27 are situated on the lower (rear) surface of the arm 21. Thus, each arm 21 in the depicted embodiment has four grooves 27. The depth of a groove 27 is approximately 35 to 45% of the thickness of the single-crystal wafer 10. As shown in FIG. 1B, an elevational section across an arm including a groove 27 has a substantially H-shaped profile as a result of the grooves 27 being present on both surfaces (upper and lower) of the arm. The grooves 27 effectively lower the CI value of the device 20.

The base portion 29 of the tuning-fork type crystal vibration device 20 has a substantially board-shape. The length of the base 29 relative to the length of an arm is approximately 36%. Extending downward from an edge of the base 29 as shown, opposite the edge of the base 29 from which the arms 21 extend, are a pair of connecting portions 28. The connecting portions 28 are formed by the photolithography and wet-etching steps used for forming the tuning-fork profile outline shown in FIG. 1A. The connecting portions 28 connect the tuning-fork type crystal vibrating device 20 to the single-crystal wafer 10 during manufacture.

On the pair of arms 21 and the base 29 of the device 20 are situated a first electrode pattern 23 and a second electrode pattern 25. On the base 29, as shown in FIG. 1A, a first base electrode 23a and a second base electrode 25a are situated. In the groove 27, a first groove electrode 23d and a second groove electrode 25d are situated. Also, as shown in FIG. 1B, on both side surfaces of the left arm 21, second side-surface electrodes 25c are situated. Similarly, on both side surfaces of the right arm 21, first side-surface electrodes 23c (not detailed) are situated. A first connecting electrode 23b and a second connecting electrode 25b electrically connect the first base electrode 23a and the second base electrode 25a, the first side-surface electrode 23c and the second side-surface electrode 25c, and the first groove electrode 23d and the second groove electrode 25d. Also, "weights" WE are situated on surfaces of relatively distal portions of the arms 21.

The first base electrode 23a and the second base electrode 25a, the first connecting electrode 23b and the second connecting electrode 25b, and the weights WE each have a two-metal-layer structure comprising first and second metal layers. In contrast, the first side-surface electrode 23c, the second side-surface electrode 25c, the first groove electrode 23d, and the second groove electrode 25d each have a single-metal-layer structure comprising one metal layer. The two-metal-layer structure comprises, for example, a gold (Au) layer of 150 to 5000 Ångstroms thickness formed on a chrome (Cr) layer of 100 to 5000 Ångstroms thickness. That is, the first and second metal layers have a combined thickness of 250 to 10,000 Ångstroms. In alternative structures, the chrome (Cr) layer can be replaced with a tungsten (W), nickel (Ni), nickel-tungsten, or titanium (Ti) layer. A silver (Ag) layer can be used instead of the gold (Au) layer.

Meanwhile, the single-layer metal-film structure comprises, for example, a chrome (Cr) layer of 150 to 5000 Ångstroms thickness. In alternative structures, the chrome (Cr) layer can be replaced with a tungsten (W), nickel (Ni), nickel-tungsten, or titanium (Ti) layer. Since regions such as the grooves 27 are relatively thinner in the thickness dimension than other parts of the device 20, these regions are easily affected by differences in coefficients of thermal expansion of the crystal itself, of the chrome layer, and of the gold layer. Thus, structures such as electrodes in or near the grooves 27 comprise only a single-metal layer to reduce differences in coefficients of thermal expansion that otherwise would be caused by multiple layers of different metals. Also, single-metal-layer structures in these regions impart less stress to the arms during thermal processes. These features also reduce fluctuations in vibration frequency of the arms. Note that the coefficient of thermal expansion of quartz crystal at normal temperature (parallel to the z-axis) is $7.97 \times 10^{-6}$, the coefficient of thermal expansion of quartz crystal (horizontal to the z-axis) is $13.4 \times 10^{-6}$, the coefficient of thermal expansion of gold is $14.2 \times 10^{-6}$, and the coefficient of thermal expansion of chrome is $4.9 \times 10^{-6}$.

FIG. 1C is a schematic view of the overall configuration of another embodiment of a tuning-fork type crystal vibrating device 20'. The device 20' has almost the same configuration as the device 20 of FIG. 1A, except that the first connecting electrode 23d and second connecting electrode 25b are each a single metal layer (rather than a double metal layer) in the device 20'.

The tuning-fork type crystal vibrating devices 20, 20' are mounted on respective ceramic bases 51c (FIGS. 2B and 2C) using electrically conductive adhesive 31. To achieve higher conductivity to the electrically conductive adhesive 31, gold is preferably used for the second layer of the first base electrode 23a and of the second base electrode 25a. Since the first connecting electrode 23b and second connecting electrode 25b do not contact the electrically conductive adhesive, the second metal layer of each of these electrodes need not be gold. For example, the second metal layer of the first connecting electrode 23b and second connecting electrode 25b of the tuning-fork type crystal vibrating device 20' can be chrome, which is lower in cost than gold.

By way of example, the following description is provided with reference to the tuning-fork type crystal vibrating device 20 shown in FIG. 1A.

Configuration of the Crystal Resonator 50

Figure 2B:
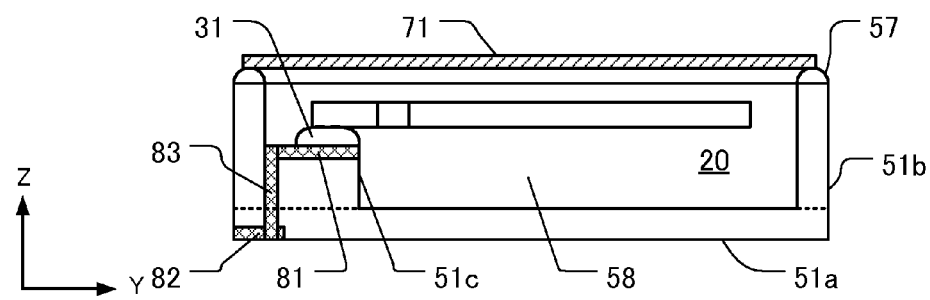
FIG. 2B is a cross-sectional view of the embodiment of FIG. 2A.
Figure 2C:
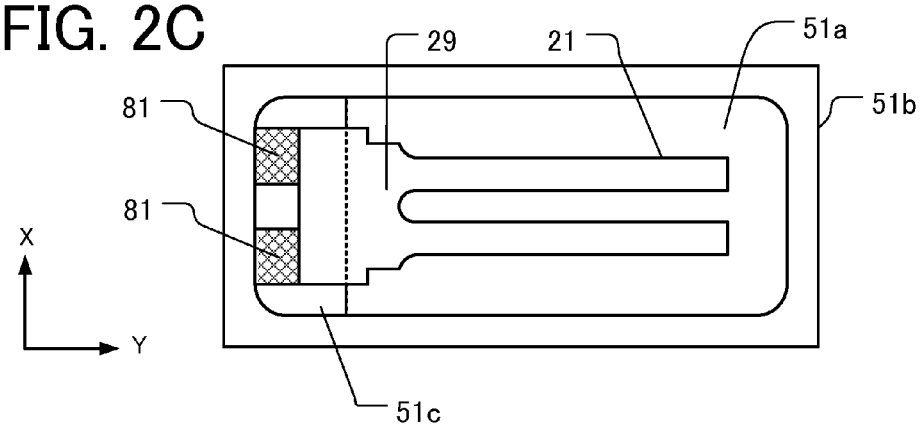
FIG. 2C is a plan view of the embodiment of FIGS. 2A-2B, with the metal lid 71 removed.

An embodiment of a crystal resonator 50 is described with reference to FIGS. 2A-2C, in which FIG. 2A is a schematic view of the crystal resonator 50, FIG. 2B is a cross-sectional view, and FIG. 2C is a top view (with metal lid 71 removed to show underlying detail). The crystal resonator 50 comprises an insulating ceramic package 51 and a metal lid 71. The metal lid 71 desirably is made of Kovar (Fe/Ni/Co). The ceramic package 51 comprises a first ceramic layer for forming the bottom 51a, a second ceramic layer for forming walls 51b, and a third ceramic layer for forming the base 51c of the package. These layers are press-cut from ceramic "green sheet" made of ceramic alumina-based ceramic powder or ceramic slurry including a binder. Representative alternative materials for forming the ceramic package 51 include glass ceramic or non-shrink glass-ceramic base board instead of alumina-based ceramic powder. As understood from FIG. 2B, the package comprises multiple ceramic layers 51a, 51b, 51c that form a cavity 58. The tuning-fork type crystal vibrating device 20 shown in FIGS. 1A and 1C is mounted within the cavity 58.

The wiring pattern of the base 29 includes a conductive area that electrically contacts electrically conductive adhesive 31 used for mounting the device 20 inside the cavity 58. Specifically, the device 20 is bonded to the ceramic base 51c using the adhesive 31, allowing the vibrating arms 21 to extend horizontally in a cantilever manner so that they are free to generate a predetermined vibration. The top of the ceramic layer forming the base 51c includes a wiring layer 81 that provides electrical contact with the region of the device 20 that is bonded using the adhesive 31. At least two terminal electrodes 82, formed at the bottom of the ceramic package 51, serve as external terminals when the package is surface-mounted on a printed substrate (circuit board, not shown). Internal wiring 83 electrically connects the wiring layer 81 with respective terminal electrodes 82.

For attachment of the lid 71, a metallization layer is formed on the upper edge of the ceramic layer for the wall 51b. A sealing material 57 made of low-temperature brazing filler metal is formed on the upper edge. The lid 71 is bonded to the ceramic layer for the wall 51b using the sealing material 57.

Configuration of Single-Crystal Wafer

Figure 3:
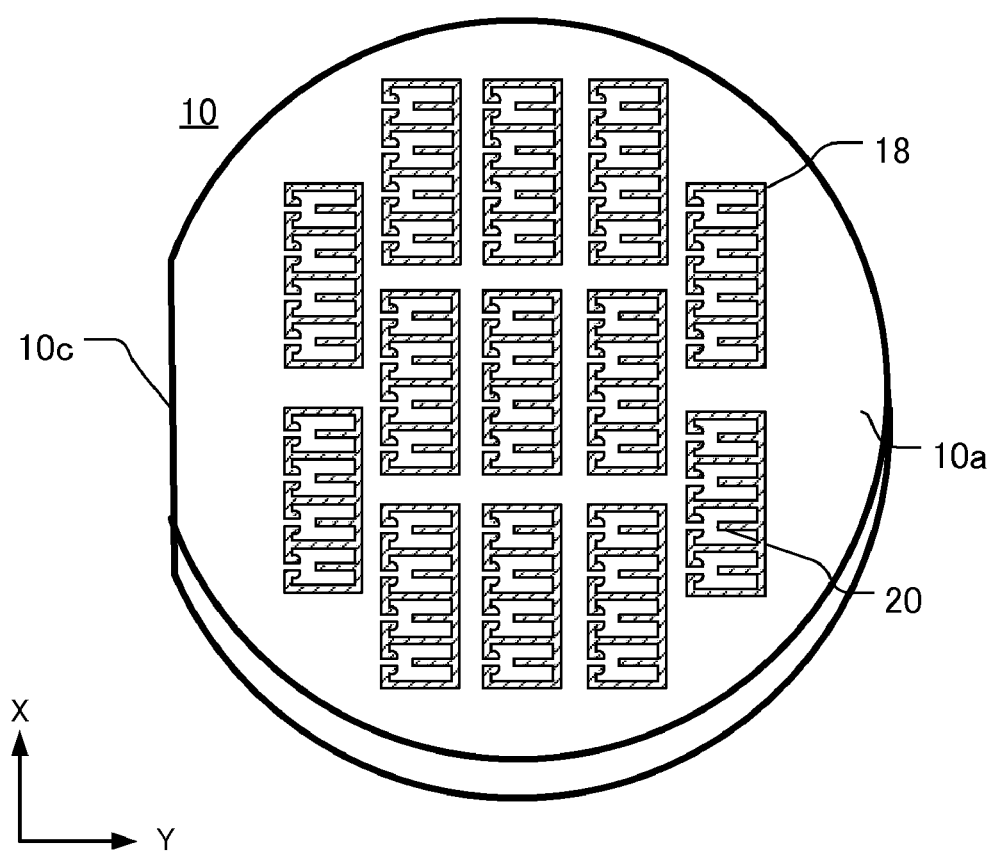
FIG. 3 is a perspective view of a surface of a circular single-crystal wafer 10 on which multiple tuning-fork type crystal vibrating devices 20 have been formed, showing the profile outlines of the devices.

FIG. 3 depicts an embodiment of a single-crystal wafer 10 on which pattern-exposure and development have been performed to define the profile outlines of multiple tuning-fork type crystal vibrating devices 20. FIG. 3 is a perspective view of the circular single-crystal wafer 10. The circular single-crystal wafer 10 is made of synthetic crystal having, for example, a thickness of 0.1 mm and a diameter of three to four inches. To determine an axial direction of the circular single-crystal wafer 10, as shown in FIG. 3, an orientation flat 10c is formed on a portion of the periphery of the wafer 10 to define the lattice orientation of the crystal.

An actual circular single-crystal wafer 10 would contain several thousand tuning-fork type crystal vibrating devices 20, formed by a method involving photolithography and wet-etching steps. Due to relationships between process-management and wafer strength, multiple windows 18 are typically formed, and several dozen to several hundred tuning-fork type crystal vibrating devices 20 are formed in each window. The positions and orientations of the windows 18 and of the individual devices 20 are defined relative to the orientation flat 10c.

Process for Manufacturing Tuning-Fork Type Crystal Vibrating Devices

FIGS. 4-7 are flow charts of respective portions of a process for forming the arm profiles, grooves, and electrodes of an exemplary tuning-fork type crystal vibrating device 20. Each depicted step of forming the arms includes a respective elevational section of the single-crystal wafer 10 showing the structure resulting from the respective step.

Figure 4:
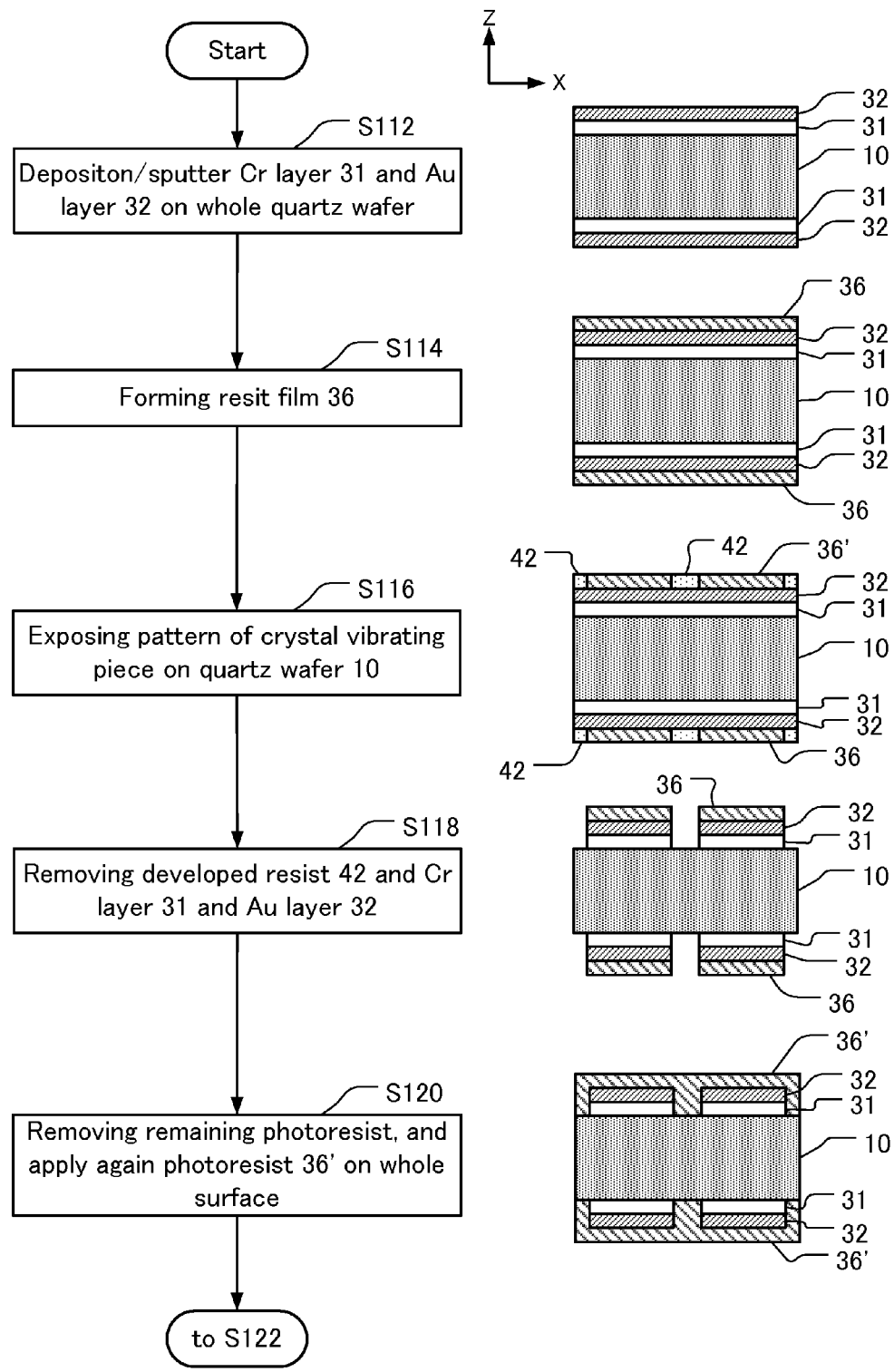
FIG. 4 is a flow-chart of an embodiment of a manufacturing method, particularly of the portion of the method in which the profile of the tuning-fork type crystal vibrating devices 20 and their respective grooves are defined.

Forming the Profile Outline and Grooves of the Tuning-Fork Type Crystal Vibrating Device First, a single-crystal wafer 10 is prepared at step S112 in FIG. 4. Then, a corrosion-resistant metal film is applied, by sputtering or vacuum deposition for example, to the entire surface of the single-crystal wafer 10. Gold (Au) or silver (Ag) are desirable for forming the corrosion-resistant film. However, when a single-crystal wafer 10 is used as a piezoelectric material, it is difficult to form gold (Au) or silver (Ag) directly on the wafer surface. Hence, a layer of chrome (Cr), nickel (Ni), or titanium (Ti) is first applied as a base coat. In the depicted embodiment, the corrosion-resistant film is a layer of chromium (Cr) 31 with an overlying layer of gold (Au) 32. By way of example, the thickness of the chrome layer 31 is 50 to 1000 Ångstroms, and the thickness of the gold layer 32 is 100 to 5000 Ångstroms. The single-crystal wafer 10 upon completion of step 112 is shown on the right of step S112.

In step S114, on the corrosion-resistant film a photoresist layer 36 is applied evenly by spin-coating, for example. An example photoresist 36 is a positive photoresist with Novella resin. The single-crystal wafer 10 upon completion of step S114 is shown on the right of step S114.

Next, in step S116, an exposure apparatus and photomask (not shown) are used to expose and thus form the profile outline of the tuning-fork type crystal vibrating device 20 in the photoresist layer 36. The resulting pattern of exposed photoresist 42 and unexposed photoresist 36 is shown to the right of step S116.

In step S118, the pattern-exposed photoresist layer 36 is developed, and the exposed photoresist 42 is removed. Portions of the gold layer 32 now revealed by removal of the exposed photoresist 42 are etched using an aqueous solution of iodine and potassium iodide. Then, portions of the underlying chrome layer 31 revealed by removing corresponding portions of the gold layer 32 are etched using, for example, an aqueous solution of ceric ammonium nitrate and acetic acid. The concentrations of these etchants, etching temperature, and etching time are controlled to avoid over-etch. Completion of etching results in complete removal of the corrosion-resistant film from the revealed locations. As shown to the right of step S118, a structure is thus formed in which the single-crystal wafer 10 now defines the profile outline of the tuning-fork type crystal vibrating device 20.

In step S120, remaining photoresist 36 is stripped, and a new layer of photoresist 36' is applied by spin-coating or spraying, for example. The result of this step is shown to the right of step S120.

Turning now to FIG. 5, in the next step S122 a pattern defining the grooves 27 is exposed on corresponding regions of the photoresist 36' on the surfaces of the vibrating arms 21. The result of this step is shown to the right of step S122.

In step S124, the photoresist 36' is developed, and the exposed regions 42' thereof are removed. As shown to the right of step S124, the exposed photoresist 42' is removed in regions destined to become grooves 27, but the corrosion-resistant film is still present in these regions. Removal of the photoresist 42' forms a structure in which the profile outline of the tuning-fork type single-crystal vibrating devices reappears, as shown to the right of step S118. The result of this step is shown to the right of step S124.

In step S126, regions of the crystal material 10 revealed by removal of the exposed photoresist layer 42' are wet-etched. The wet-etching solution can be, for example, hydrofluoric acid (HF) or ammonium bifluoride ($NH_4F/HF$). The result of this step is shown to the right of step S126.

In step S128, the revealed corrosion-resistant film in the groove regions 27 is removed by another etching step to form the grooves on the arms. The gold layer 32 of the corrosion-resistant film is etched using, for example, an aqueous solution of iodine and potassium iodide. Then, the chrome layer 31, revealed by removing respective portions of the overlying gold layer 32, is etched using an aqueous solution of ceric ammonium nitrate and acetic acid, for example. The result of this step is shown to the right of step S128.

Next, in step S130, wet-etching is performed on the crystal material 10 to form the grooves 27. Example etching solutions are hydrofluoric acid (HF) or ammonium bifluoride ($NH_4F/HF$). Etching progresses into the thickness dimension of the crystal material 10 by removal of the photoresist layer 36' and subsequent removal of wet-etching of the revealed regions of the corrosion-resistant film, to form the grooves 27. As shown to the right of step S130, etching is carefully controlled to prevent etching completely through the crystal material in the grooves 27 (such over-etching would cause the grooves to become through-holes).

Next, in step S132, remaining portions of the photoresist layer 36', the chrome layer 31, and the gold layer 32 on the tuning-fork type crystal vibrating device 20 are removed to complete formation of the grooves 27 on the arms 21. The structure resulting from this step is shown to the right of step S132.

Electrode-Formation Process

Figure 6:
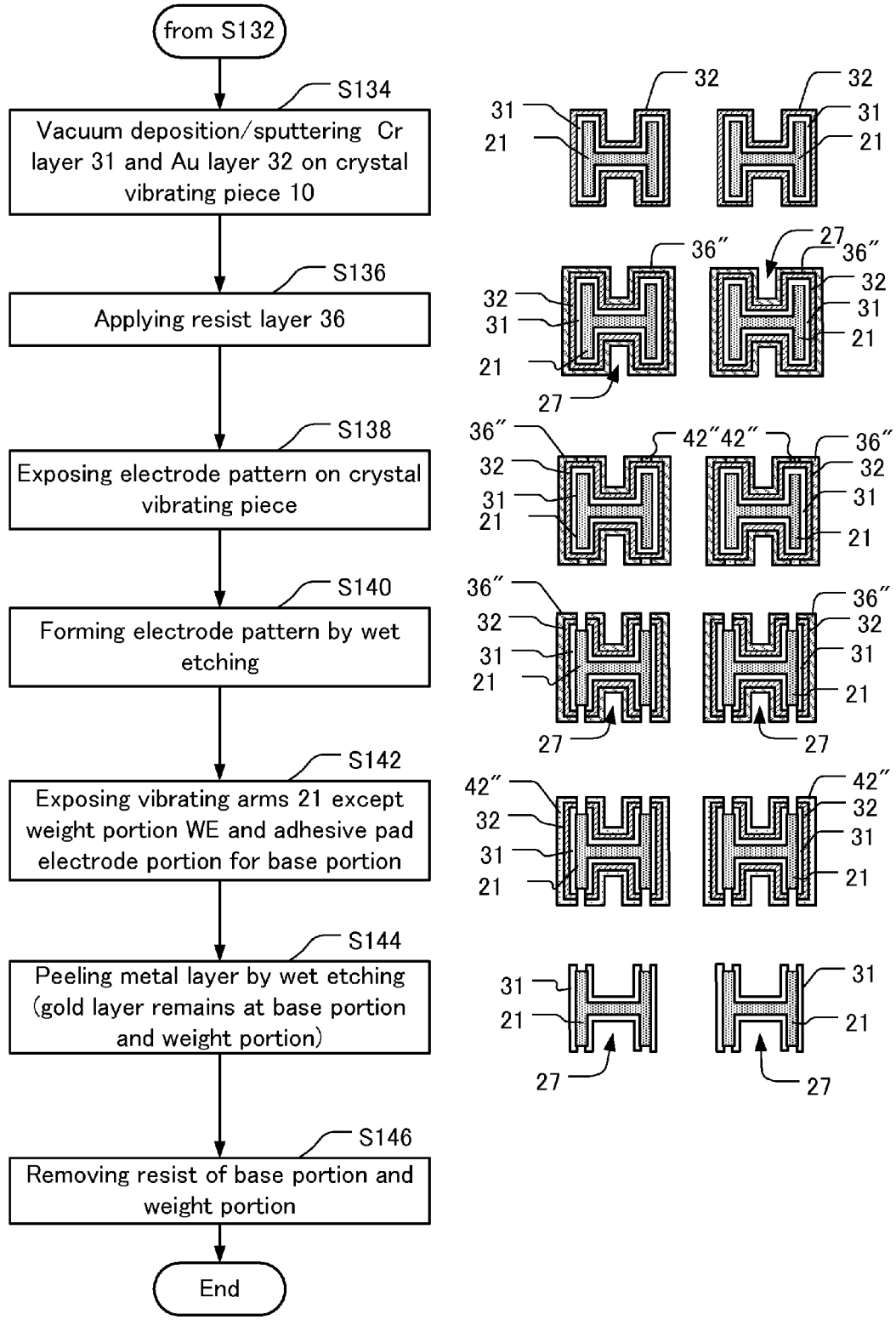
FIG. 6 is a flow-chart of subsequent steps in the method of which earlier steps are shown in FIGS. 4 and 5.

Turning now to FIG. 6, in step S134, the tuning-fork type crystal vibrating device 20 is washed with purified water, followed by formation of a first metal layer 31 over the entire device 20. The first metal layer 31 is formed of chrome (Cr), nickel (Ni), or titanium (Ti), and serves as a base coat for subsequent formation of a second metal layer 32 that, together with the first metal layer 31, will be configured into driving electrodes for the device 20. The first metal layer 31 is formed by vacuum-deposition or sputtering. In this depicted embodiment, the first metal layer 31 is of chrome 31, and the second metal layer 32 is of gold. By way of example, the thickness of the chrome layer 31 is 50 to 1000 Ångstroms, and the thickness of the gold layer 32 is 100 to 5000 Ångstroms. The result of this step is shown to the right of step S134.

In step S136 a photoresist 36" is applied over the device 20 by spraying or the like. Because the grooves 27 have already been formed, the photoresist 36" is applied evenly on all surfaces of the grooves 27 as well as regions other than the grooves. The result of this step is shown to the right of step S136.

In step S138, a photomask of the electrode pattern is prepared and used for lithographic exposure of the electrode patterns into the photoresist layer 36". The electrode pattern is exposed on both sides (upper and lower) of the tuning-fork type crystal vibrating device 20. The regions of exposed photoresist 42" and non-exposed photoresist 36" on the vibrating arm 21 are depicted to the right of step S138.

In step S140, the photoresist layer 36" is developed and the exposed photoresist 42" is removed. The remaining photoresist 36" corresponds to the electrode pattern and serves as an etching mask. Wet-etching of the metal film destined to become electrodes is performed. That is, portions of the gold layer 32 revealed by removing the exposed photoresist 42" and corresponding to the electrode pattern is etched by, for example, an aqueous solution of iodine and potassium iodide. Then, the newly revealed underlying chrome layer 31 is etched by an aqueous solution of ceric ammonium nitrate and acetic acid. A vibrating arm including the electrode is depicted to the right of step S140.

In the figure to the right of step S140, unexposed photoresist 36" remains in the grooves 27 and on the side surfaces of the vibrating arm 21. In step S142 further exposure is made of the remaining photoresist layer 36" on the vibrating arm 21. As shown to the right of step S142, exposed photoresist 42" extends around the vibrating arm 21 (except in regions destined to be weights WE).

In step S144, the photoresist layer 36" is developed, and the exposed photoresist 42" is removed. Portions of the gold layer 32 revealed by removal of the exposed photoresist is etched by, for example, an aqueous solution of iodine and potassium iodide. At this point in the process, the gold layer 32 has been removed from the entire vibrating arm 21 (except in the weight regions WE) to reveal the underlying chrome layer 31. The removed gold (Au) can be recovered from the etching solution. This removal of the gold layer 32 from many parts of the vibrating arm 21 yields a vibrating arm 21 exhibiting less fluctuation of vibration frequency that otherwise would occur during times of thermal expansion.

In step S146, the remaining portions of the photoresist layer 36" on the base and weight WE are stripped. Upon removal of the remaining photoresist, corresponding regions of the gold layer 32 remain on the base 29 and weight WE. Thus, whereas the chrome layer 31 and gold layer 32 are retained on the base 29 and weight WE of the device 20, the electrodes 23, 25 have only the chrome layer 31 remaining on the surfaces of the grooves 27 and on side surfaces of the vibrating arm 21.

Frequency-Adjustment and Packaging

From the previous steps, the tuning-fork type crystal vibrating device 20 including the electrodes 23, 25 and the grooves 27 is obtained. Referring now to FIG. 7, at step S148 the tuning-fork type crystal vibrating device 20 is attached to its ceramic package 51 using the electrically conductive adhesive 31. In particular, the base 29 of the tuning-fork type crystal vibrating device 20 is mounted on the electrically conductive adhesive 31 applied to the wiring layer 81. Then, the electrically conductive adhesive 31 is partially hardened. Completion of hardening of the electrically conductive adhesive 31 is performed in a hardening furnace. Thus, the tuning-fork type crystal vibrating device 20 is attached to the terminal electrodes 82.

For frequency tuning, a laser beam is irradiated onto the weight WE on the relatively distal ends of the vibrating arms 21. Laser-irradiation of portions of the two-metal layer on the weight WE evaporates and sublimes the metals to reduce the mass and thus increase the vibration resonance frequency of the arms. The weights WE have mass because they comprise two metal layers (e.g., chrome and gold). This mass is available, for selective removal by laser irradiation, to adjust the vibration frequency of the arms.

Next, in step S150, the package 51 in which the tuning-fork type crystal vibrating device 20 is mounted is moved to a vacuum chamber, in which the lid 71 is welded by the sealing material 57 to the package.

Finally, in step S152, performance of the piezoelectric vibrating device 50 is tested and confirmed to specifications. Devices passing this step represent completed piezoelectric vibrating devices 50.

Various representative embodiments are described above. However, it will be understood by persons of ordinary skill in the art that any of the foregoing embodiments can be modified or changed while remaining within the scope of the invention. For example, in the tuning-fork type piezoelectric vibrating device, the crystal material can be a piezoelectric single-crystal material such as lithium niobate.

The foregoing descriptions were made in the context of the single-crystal wafer 10 shown in FIG. 3. Alternatively, a combination wafer (comprising multiple single-crystal wafers combined) can be used. A combined crystal wafer used for a gyro comprises first and second crystal wafers cut in the z-direction. The first and second crystal wafers are directly bonded to each other by a siloxane bond, or other suitable bond, having high thermal resistance. A siloxane bond is produced by cleaning both crystalline surfaces of a first and a second crystal wafer. The surfaces are bonded to each other and then annealed at 500 C. The resulting bonded wafer can be used for forming the vibrating devices described herein.

Also, although the embodiments are described in the context of crystal resonator 50, they also can be applied to, for example, a tuning-fork crystal vibrating device for use as a vibrating oscillator. That is, by mounting on a single IC a drive circuit as well as the tuning-fork type crystal vibrating device piece 20 driven by the circuit, and mounting the IC in the same package (e.g., FIG. 2), a piezoelectric device such as piezoelectric oscillator or a real-time clock can be configured.

What is claimed is:

1. A method for manufacturing a piezoelectric vibrating device, comprising:
    on a surface of a wafer made of a piezoelectric material, forming a profile outline of a desired piezoelectric vibrating device including a base and at least two arms extending from the base;
    on a surface of the wafer within the profile outline, forming a first metal layer comprising at least one of chrome (Cr), nickel (Ni), and titanium (Ti);
    on at least one selected region of the first metal layer, forming a second metal layer comprising at least one of gold (Au) and silver (Ag);
    on at least one selected region of the second metal layer, forming an electrode pattern; and
    from at least one selected location within the electrode pattern, peeling away the second metal layer to form an electrode on the piezoelectric vibrating device comprising the first metal layer but not the second metal layer.

2. The method of claim 1, wherein:
    each vibrating arm defines at least one groove region; and
    the selected location for peeling away the second metal layer includes the at least one groove.

3. The method of claim 1, wherein forming the electrode pattern comprises:
    applying a layer of photoresist on the second metal layer;
    performing a first exposure to pattern the photoresist in the selected region with an electrode pattern; and
    performing a first removal step comprising removing exposed photoresist in the selected region to reveal a first corresponding region of the first and second metal layers that is vulnerable to etching, and etching the first and second metal layers in the first corresponding region.

4. The method of claim 3, wherein:
each vibrating arm defines at least one groove region; and
the selected location for peeling away the second metal layer includes the at least one groove region.

5. The method of claim 3, wherein the step of peeling the second metal layer comprises:
after the first removal step, performing a second exposure to pattern a layer of photoresist with a second profile outline in the selected location from which the second metal layer is to be peeled; and
performing a second removal step comprising removing exposed resist from the predetermined location to reveal, in the second profile outline, a second corresponding region that is vulnerable to etching, and etching the second metal layer in the second corresponding region.

6. The method of claim 5, wherein:
each vibrating arm defines at least one groove; and
the predetermined location includes the at least one groove.

7. The method of claim 1, further comprising forming on each arm at least one weight, each weight comprising a region including the first and second metal layers.

8. The method of claim 7, further comprising trimming mass of the first and second metal layers from the weight to tune a vibration frequency of the arms.

* * * * *